United States Patent
Moon et al.

(10) Patent No.: US 9,207,389 B2
(45) Date of Patent: Dec. 8, 2015

(54) LIGHT EMITTING MODULE AND ILLUMINATION SYSTEM INCLUDING THE SAME

(75) Inventors: Yon Tae Moon, Seoul (KR); Hiroshi Kodaira, Seoul (KR)

(73) Assignee: LG Innotek Co., Ltd., Seoul (KR)

(*) Notice: Subject to any disclaimer, the term of this patent is extended or adjusted under 35 U.S.C. 154(b) by 651 days.

(21) Appl. No.: 13/543,015

(22) Filed: Jul. 6, 2012

(65) Prior Publication Data

US 2013/0010495 A1  Jan. 10, 2013

(30) Foreign Application Priority Data

Jul. 7, 2011  (KR) .......................... 10-2011-0067165

(51) Int. Cl.
| | |
|---|---|
| *F21V 7/04* | (2006.01) |
| *F21V 8/00* | (2006.01) |
| *F21V 29/83* | (2015.01) |
| *H01L 33/60* | (2010.01) |

(52) U.S. Cl.
CPC .............. *G02B 6/0073* (2013.01); *F21V 29/83* (2015.01); *G02B 6/003* (2013.01); *G02B 6/0068* (2013.01); *G02B 6/0083* (2013.01); *G02B 6/0085* (2013.01); *H01L 33/60* (2013.01); *H01L 2224/48091* (2013.01)

(58) Field of Classification Search
CPC .. G02B 6/0073; G02B 6/0068; G02B 6/0031; G02B 6/0083; G02B 6/0085; G02B 6/0021; G02B 6/0035; G02B 6/009; G02B 6/0045; G02B 6/0055; G02B 1/105
USPC ......................................................... 362/612
See application file for complete search history.

(56) References Cited

U.S. PATENT DOCUMENTS

| | | | |
|---|---|---|---|
| 6,377,292 B1* | 4/2002 | Shimizu et al. | 347/238 |
| 6,949,772 B2* | 9/2005 | Shimizu et al. | 362/652 |
| 2007/0115671 A1* | 5/2007 | Roberts et al. | 362/367 |
| 2009/0122554 A1* | 5/2009 | Ohashi et al. | 362/296.01 |
| 2011/0199787 A1* | 8/2011 | Kim et al. | 362/612 |
| 2012/0057327 A1* | 3/2012 | Le et al. | 362/84 |

* cited by examiner

*Primary Examiner* — William Carter
(74) *Attorney, Agent, or Firm* — Ked & Associates, LLP

(57) ABSTRACT

A light emitting module is disclosed. The light emitting module includes a circuit board, a plurality of light emitting devices mounted on the circuit board and spaced apart from each other, molding parts wrapping the respective light emitting devices, and a reflective member disposed on the circuit board to surround the light emitting devices. The reflective member has a height greater than that of each of the molding parts. The reflective member has a plurality of openings exposing the light emitting devices, and each of the openings has a reflective side wall extending upward from the circuit board.

20 Claims, 13 Drawing Sheets

LIGHT EMITTING MODULE AND ILLUMINATION SYSTEM INCLUDING THE SAME

CROSS REFERENCE TO RELATED APPLICATION

This application claims priority under 35 U.S.C. §119 to Korean Patent Application No. 10-2011-0067165, filed in Korea on Jul. 7, 2011, which is hereby incorporated in its entirety by reference as if fully set forth herein.

TECHNICAL FIELD

Embodiments relate to a light emitting module and an illumination system including the same.

BACKGROUND

A light emitting device, such as a light emitting diode (LED) or a laser diode (LD), using a group III-V or II-VI compound semiconductor material may emit various colors, such as red, green, blue and ultraviolet light, as the result of advances in thin film growth technology and materials for the device. Also, the light emitting device may emit high-efficiency white light using a fluorescent material or through combination of colors. The light emitting device has advantages of lower power consumption, semi-permanent lifespan, rapid response time, safety and environmentally friendliness, which are comparable with conventional light sources, such as a fluorescent lamp or an incandescent lamp.

A light emitting device package, in which a light emitting device is mounted on a package body so that the light emitting device is electrically connected to the package body, has been widely used as a light source for display apparatuses. In particular, a chip on board (COB) type light emitting device package has been widely used in a light emitting device array form in which a plurality of light emitting devices is arranged on a board, for example by directly die-bonding LED chips to the board and electrically connecting the LED chips to the board using wire bonding.

Generally, a COB type light emitting module may include a board, LED chips arranged on the board in a line, molding parts to surround the respective LED chips, and lenses positioned on the respective molding parts.

SUMMARY

Embodiments provide a light emitting device that adjusts a view angle of light, thereby reducing optical loss, and an illumination system including the same.

In one embodiment, a light emitting module includes a circuit board, a plurality of light emitting devices mounted on the circuit board and spaced apart from each other, molding parts wrapping the respective light emitting devices, and a reflective member disposed on the circuit board to surround the light emitting devices, wherein the reflective member has a height greater than that of each of the molding parts. The reflective member has a plurality of openings exposing the light emitting devices and each of the openings has a reflective side wall extending upward from the circuit board. Each of the openings may be formed in a circular or polygonal shape.

The reflective member may be formed of polyethylene terephthalate.

The circuit board may include a heat dissipation layer, a dielectric layer disposed on one surface of the heat dissipation layer, and a first conductive layer and a second conductive layer disposed on the dielectric layer and electrically separated from each other. Each of the light emitting devices may be electrically connected to the first conductive layer and the second conductive layer. The circuit board may further include a solder resist layer disposed on the dielectric layer. At least a portion of the solder resist layer may be interposed between the first conductive layer and the second conductive layer.

The light emitting module may further include molding fixing parts disposed on the circuit board and contacting outer circumferences of the respective molding parts to fix edges of the respective molding parts.

The reflective member may be spaced apart from the molding fixing parts.

The reflective side walls may be tilted with respect to the circuit board. The light emitting module may further include a fixing member positioned between the circuit board and the reflective member.

The light emitting module may further include reflective coating layers disposed on the respective reflective side walls. Each of the reflective coating layers may be formed of at least one selected from among $TiO_2$, Ag and a reflective sheet.

At least a portion of the reflective member may be spaced apart from the molding parts. A portion of the reflective member may have a protrusion overlapping with each of the molding parts in a vertical direction.

The light emitting module may further include at least one wire to electrically connect each of the light emitting devices to the first conductive layer and the second conductive layer. Each of the molding parts may cover a corresponding one of the light emitting devices and the wire, and at least a portion of each of the molding parts may have a curvature.

The reflective member may include a plurality of layers, and the uppermost surface of the reflective member may be higher than the uppermost surface of each of the molding parts. The outer circumference of each of the molding parts may contact the lateral surface of a corresponding one of the reflective side walls.

In another embodiment, an illumination system includes a bottom cover, a reflective plate disposed on the bottom cover, a light guide plate disposed on the reflective plate, wherein the light guide plate has an incidence surface upon which light is incident, a light emitting module to emit light to the incidence surface, an optical sheet disposed on the light guide plate, and a display panel disposed on the optical sheet. The light emitting module may be one of the previous embodiments.

The distance from the incidence surface to the uppermost surface of each of the molding parts is greater than the distance from the incidence surface to the uppermost surface of a corresponding one of the reflective side walls.

The uppermost surface of each of the reflective side walls may contact the incidence surface, and the uppermost surface of each of the molding parts may be spaced apart from the incidence surface.

BRIEF DESCRIPTION OF THE DRAWINGS

Arrangements and embodiments may be described in detail with reference to the following drawings in which like reference numerals refer to like elements and wherein.

DESCRIPTION OF SPECIFIC EMBODIMENTS

Figure 1:
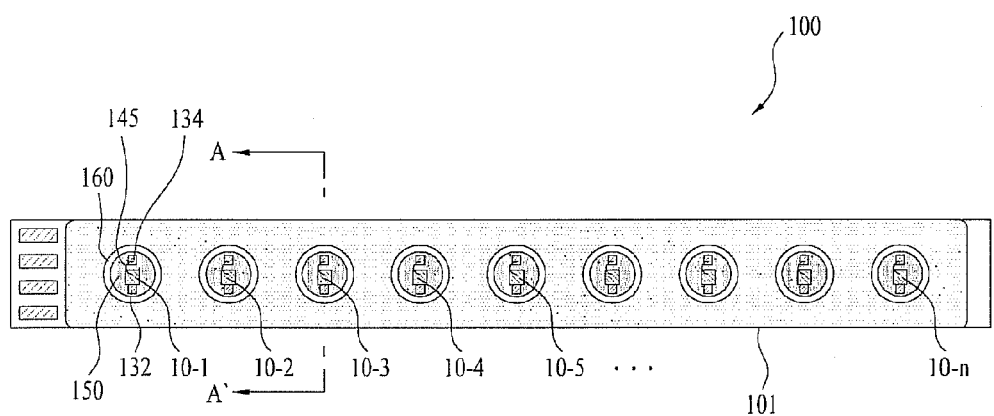
FIG. 1 is a view showing a light emitting module according to an embodiment.

Hereinafter, embodiments will be described with reference to the annexed drawings. It will be understood that when an element is referred to as being 'on' or 'under' another element, it can be directly on/under the element, and one or more intervening elements may also be present. When an element is referred to as being 'on' or 'under', 'under the element' as well as 'on the element' can be included based on the element.

In the drawings, the sizes of respective layers are exaggerated, omitted, or schematically illustrated for convenience and clarity of description. Further, the sizes of the respective elements do not denote the actual sizes thereof. Also, wherever possible, the same reference numbers will be used throughout the drawings to refer to the same or like parts.

Figure 2:
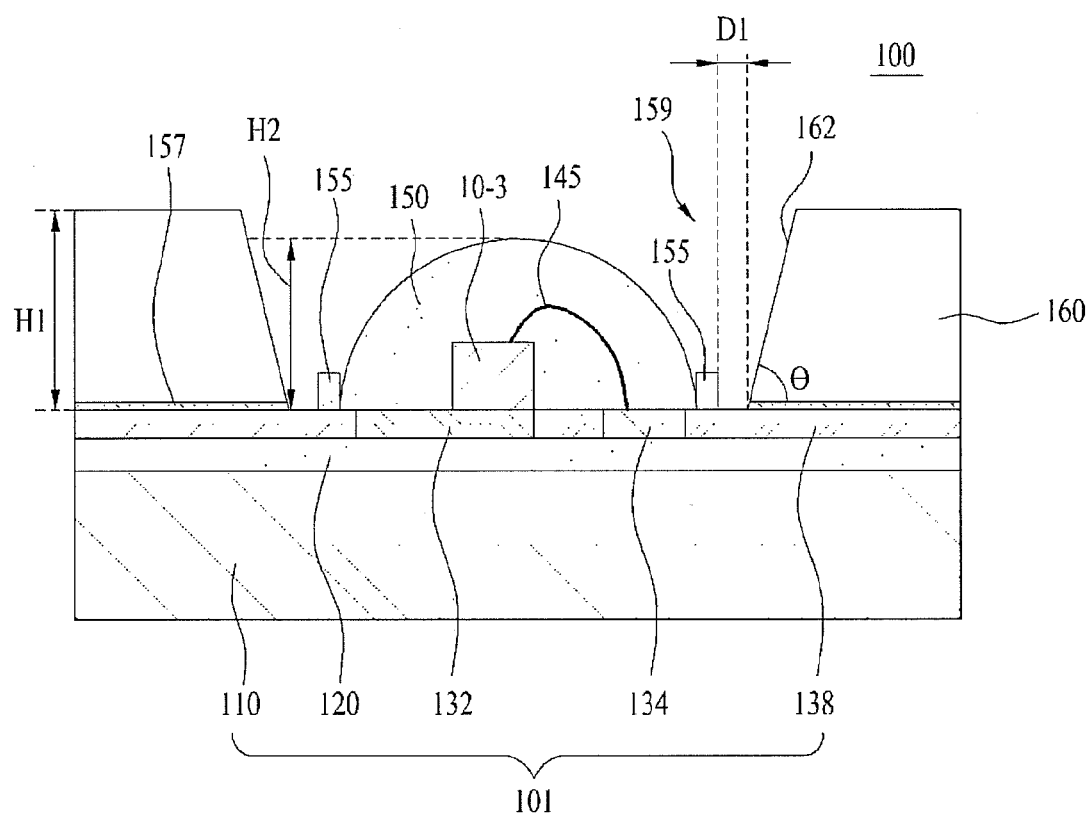
FIG. 2 is a sectional view of the light emitting module shown in FIG. 1 when viewed in an A-A' direction.

FIG. 1 is a view showing a light emitting module 100 according to an embodiment, and FIG. 2 is a sectional view of the light emitting module 100 shown in FIG. 1 when viewed in an A-A' direction.

Referring to FIGS. 1 and 2, the light emitting module 100 includes a circuit board 101, a plurality of light emitting devices 10-1 to 10-$n$ (n is a natural number greater than 1), wires 145, molding parts 150, molding fixing parts 155, and a reflective member 160.

The light emitting devices 10-1 to 10-$n$ are mounted on the circuit board 101 and the light emitting devices 10-1 to 10-$n$ are spaced apart from each other. Each of the light emitting devices 10-1 to 10-$n$ may be a vertical light emitting diode.

Figure 3:
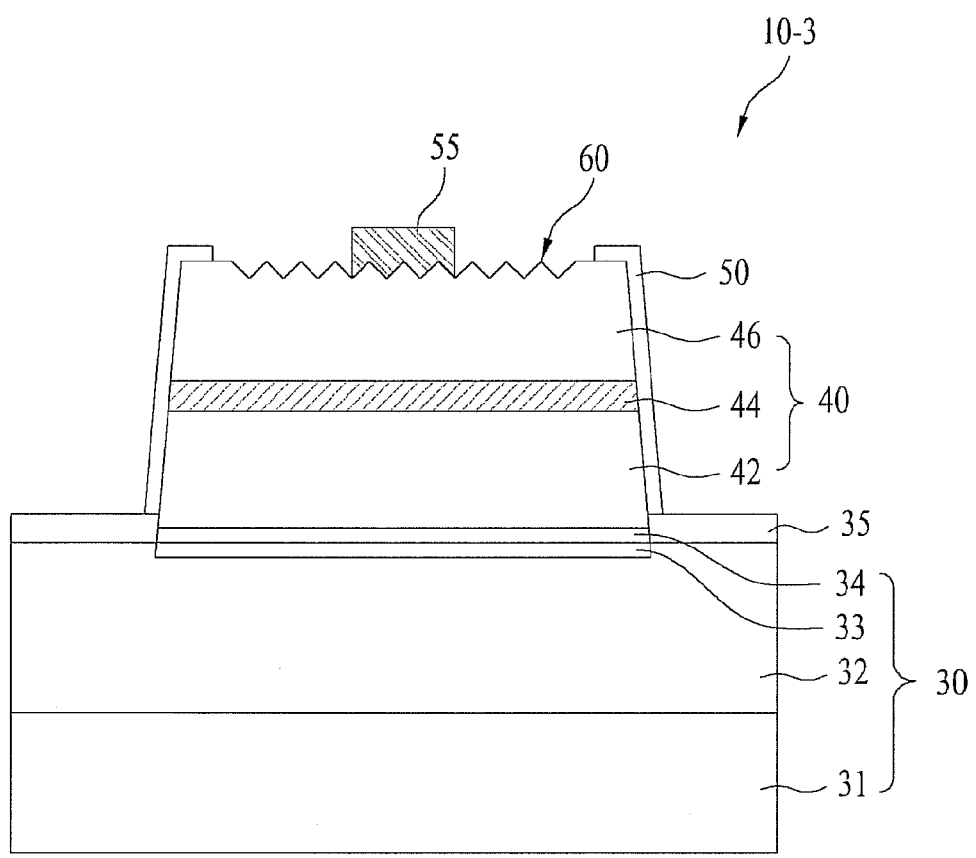
FIG. 3 is a view showing an embodiment of a light emitting device shown in FIG. 2.

FIG. 3 is a view showing an embodiment of the light emitting device 10-3 shown in FIG. 1. Referring to FIG. 3, the light emitting device 10-3 includes a second electrode layer 30, a protection layer 35, a light emitting structure 40, a passivation layer 50, and a first electrode 55. The light emitting structure 40 includes a first conductive type semiconductor layer 46, an active layer 44, and a second conductive type semiconductor layer 42.

The second electrode layer 30 is disposed under the light emitting structure 40. The second electrode layer 30 may include a support layer 31, a bonding layer 32, a reflective layer 33 and an ohmic layer 34.

The support layer 31 supports the light emitting structure 40 and supplies power to the light emitting structure 40 together with the first electrode 55.

The bonding layer 32 is disposed on the support layer 31 to bond the reflective layer 33 and the ohmic layer 34 to the support layer 31. The reflective layer 33 is disposed on the bonding layer 32 to reflect light emitted from the light emitting structure 40, thereby improving light extraction efficiency. The ohmic layer 34 is disposed on the reflective layer 33. The ohmic layer 34 ohmic contacts the second conductive type semiconductor layer 42 of the light emitting structure 40 to achieve smooth supply of power.

The protection layer 34 is disposed on the edge of the second electrode layer 31. The protection layer 32 prevents the light emitting structure 40 and the second electrode layer 30 from being separated from each other at the interface therebetween, thereby preventing deterioration in reliability of the light emitting device 10-3.

The second conductive type semiconductor layer 42 is disposed on the ohmic layer 34. The active layer 44 is disposed on the second conductive type semiconductor layer 42. The first conductive type semiconductor layer 46 is disposed on the active layer 44.

The second conductive type semiconductor layer 42 may be formed of a group III-V compound semiconductor doped with a second conductive type dopant. The second conductive type semiconductor layer 42 may be formed of a semiconductor material having a formula of $In_xAl_yGa_{1-x-y}N$ ($0 \leq x \leq 1$, $0 \leq y \leq 1$, $0 \leq x+y \leq 1$). For example, the second conductive type semiconductor layer 42 may be selected from among GaN, AlN, AlGaN, InGaN, InN, InAlGaN, AlInN, AlGaAs, GaP, GaAs, GaAsP and AlGaInP, and may be doped with a p type dopant, such as Mg, Zn, Ca, Sr or Ba.

The first conductive type semiconductor layer 46 may be formed of a group III-V compound semiconductor doped with a first conductive type dopant. The first conductive type semiconductor layer 46 may be formed of a semiconductor material having a formula of $In_xAl_yGa_{1-x-y}N$ ($0 \leq x \leq 1$, $0 \leq y \leq 1$, $0 \leq x+y \leq 1$). For example, the first conductive type semiconductor layer 46 may be selected from among GaN, AlN, AlGaN, InGaN, InN, InAlGaN, AlInN, AlGaAs, GaP, GaAs, GaAsP and AlGaInP, and may be doped with an n type dopant, such as Si, Ge, Sn, Se or Te.

The active layer 44 may generate light using energy generated by recombination between electrons and holes provided from the first conductive type semiconductor layer 46 and the second conductive type semiconductor layer 42. The active layer 44 may be configured to have at least one selected from among a single quantum well (SQW) structure, and a multi quantum well (MQW) structure, a quantum dot structure, and a quantum wire structure.

If the active layer 44 is configured to have a quantum well structure, the active layer 44 may have a single quantum well layer structure having a formula of $In_xAl_yGa_{1-x-y}N$ ($0 \leq x \leq 1$, $0 \leq y \leq 1$, $0 \leq x+y \leq 1$) and a barrier layer having a formula of $In_aAl_bGa_{1-a-b}N$ ($0 \leq a \leq 1$, $0 \leq b \leq 1$, $0 \leq a+b \leq 1$). The energy band gap of the well layer may be lower than that of the barrier layer.

The passivation layer 50 is disposed on a lateral surface of the light emitting structure 40 to electrically protect the light emitting structure 40. However, the passivation layer 50 is not limited thereto. Roughness 60 may be formed at the upper surface of the first conductive type semiconductor layer 46 to improve light extraction efficiency of the light emitting device 10-3. The first electrode 55 is disposed on the light emitting structure 40 and the first electrode 55 contacts the first conductive type semiconductor layer 46.

The circuit board 101 may include a heat dissipation layer 110, a dielectric layer 120, a first conductive layer 132, a second conductive layer 134, and a solder resist layer 138.

The heat dissipation layer 110 may be formed of a thermally conductive material, such as aluminum (Al).

The dielectric layer 120 is disposed on one surface of the heat dissipation layer 110. The first conductive layer 132 and the second conductive layer 134 are disposed on the dielectric layer 120 so that the first conductive layer 132 and the second conductive layer 134 are electrically separated from each other. The dielectric layer 120 functions to isolate the heat dissipation layer 110 from the first conductive layer 132 and the second conductive layer 134. The heat dissipation layer 110 may have a thickness equivalent to 4 to 8 times that of the dielectric layer 120.

The solder resist layer 138 is disposed on the dielectric layer 120 and the solder resist layer 138 is interposed between the first conductive layer 132 and the second conductive layer 134. The solder resist layer 138 may be formed of an insulating material to prevent a short circuit between the first conductive layer 132 and the second conductive layer 134. The solder resist layer 138 may improve brightness of the light emitting module 100. The solder resist layer 138 may be formed of photo solder resist (PSR), particularly white PSR. However, the solder resist layer 138 is not limited thereto.

The first conductive layer 132 and the second conductive layer 134 may include at least one selected from among gold (Au), silver (Ag) and copper (Cu). The first conductive layer 132 and the second conductive layer 134 may be pattern printed to mount the light emitting device.

The light emitting device 10-3 is mounted on the first conductive layer 132. The light emitting device 10-3 may be electrically connected to the first conductive layer 132 and the second conductive layer 134.

For example, the second electrode layer 30 of the light emitting device 10-3 may be electrically connected to the first conductive layer 132, and the first electrode layer 55 of the light emitting device 10-3 may be electrically connected to the second conductive layer 134 via the wire 145.

The molding part 150 may surround the light emitting device 10-3 and the wire 145 to protect the light emitting device 10-3 and the wire 145. Also, the molding part 150 may include a fluorescent substance. The fluorescent substance may change the wavelength of light emitted from the light emitting device 10-3. At least a portion of the molding part 150 may have curvature. For example, the molding part 150 may be formed in the shape of a dome covering at least the light emitting device 10-3 and the wire 145. The molding part 150 may be formed of resin or silicone. However, the molding part 150 is not limited thereto.

The molding part 150 may individually wrap a corresponding one of the light emitting devices 10-1 to 10-n. For example, the molding parts, which wrap the light emitting devices 10-1 to 10-n, respectively, may be spaced apart from each other.

The molding fixing part 155 is disposed on the circuit board 101 and the molding fixing part 155 contacts the outer circumference of the molding part 150 to fix the edge of the molding part 150. That is, the edge of the molding part 150 protruding into the molding fixing part 155 so as to surround the light emitting device 10-3 is fixed by the molding fixing part 155. The molding part 150 may be disposed in the molding fixing part 155. The molding fixing part 155 may be disposed on the solder resist layer 138 or the dielectric layer and the molding fixing part 155 has a circular or oval side wall to fix the circumference of the molding part 150. The height of the molding fixing part 155 may be equal to or less than that of the molding part 150. The molding fixing part 155 may have a height of 40 um to 60 um.

The reflective member 160 is disposed on the circuit board 101 so as to surround the respective molding parts 150. The reflective member 160 may have a plurality of openings 159, each of which has a reflective side wall extending upward from the circuit board 101 and tilted with respect to the circuit board 101. Each of the openings 159 may be formed in the shape of a through hole, through which the light emitting device 10-3 is exposed. Each of the openings 159 may be formed in a circular, oval or polygonal shape.

For example, the reflective member 160 may be disposed on the solder resist layer 138 so as to surround the circumference of each of the molding parts 150.

The reflective member 160 may have through holes extending upward from the circuit board 101. Each of the through holes may be formed in a shape having a tilted side wall. For example, the reflective member 160 may have through holes 159 disposed around each of the molding parts 150, and each of the molding parts 150 can be exposed through a corresponding one of the through holes 159. Each of the through holes 159 may be provided at the inside thereof with a reflective side wall 162 having a predetermined tilt θ with respect to the circuit board 101. The reflective side wall 162 may reflect light emitted from the light emitting device 10-3.

At least a portion of the reflective member 160 may be spaced from each of the molding fixing parts 155 by a predetermined distance D1.

In this embodiment, no cavity is formed around each of the light emitting devices, and therefore, a large amount of light emitted from the light emitting devices can be emitted to the side of the light emitting module 100. Consequently, the reflective member 160 may reflect the light directed to the side of the light emitting module 100 to adjust a view angle of the light emitting module 100.

The height H1 of the reflective member 160 may be greater than the height H2 of each of the molding parts 150. For example, the uppermost surface of the reflective member 160 may be higher than that of each of the molding parts 150. As a result, the molding parts 150 of the light emitting module 100 are prevented from contacting a light guide plate 820 of a backlight unit or a display apparatus 800 (see FIG. 13), thereby preventing damage to the light emitting module due to contact.

The reflective member 160 may be formed of polyethylene terephthalate (PET) having a reflectance of 90% or more.

The reflective member 160 may be fixed to the circuit board 101 by a fixing member 157. For example, the reflective member 160 may be fixed to the dielectric layer or the solder resist layer 138 by a bonding agent or a double-sided adhesive tape.

In this embodiment, the view angle of the light emitting module 100 is adjusted by the reflective side wall 162 formed of PET exhibiting high reflectance, thereby reducing the amount of light emitted through the side of the light emitting device 10-3.

Figure 4:
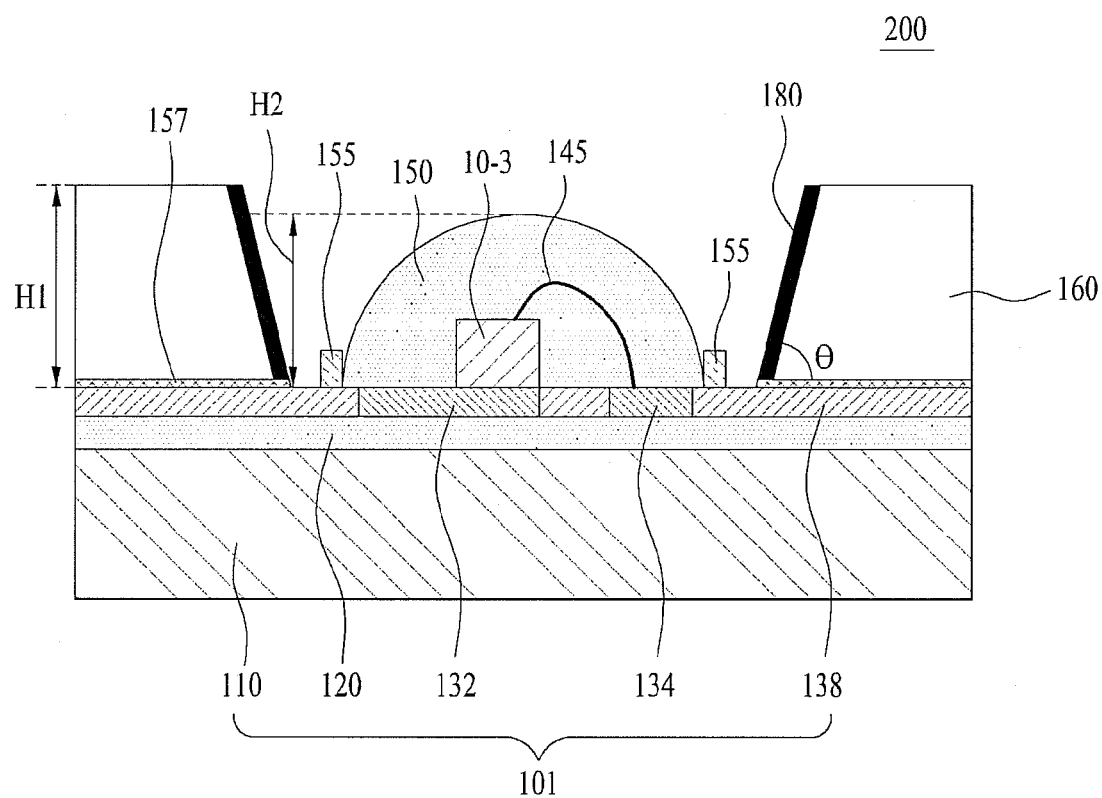
FIG. 4 is a sectional view showing a light emitting module according to another embodiment.

FIG. 4 is a sectional view showing a light emitting module 200 according to another embodiment. Components of this embodiment identical to those of the embodiment shown in FIG. 1 are denoted by the same reference numerals, and a duplicated description thereof will be omitted or briefly given.

The light emitting module 200 shown in FIG. 4 is identical to the light emitting module 100 shown in FIG. 2 except that the light emitting module 200 further includes a reflective coating layer 180. The reflective coating layer 180 may be disposed on the reflective side wall 162 of the reflective member 160. The reflective coating layer 180 may be formed of at least one selected from among $TiO_2$, Ag, Cr, Ni, Al, Rh, Pd, Ir, Ru, Mg, Zn, Pt, Au and Hf or a reflective sheet. The reflective coating layer 180 may include one or more layers.

Figure 5:
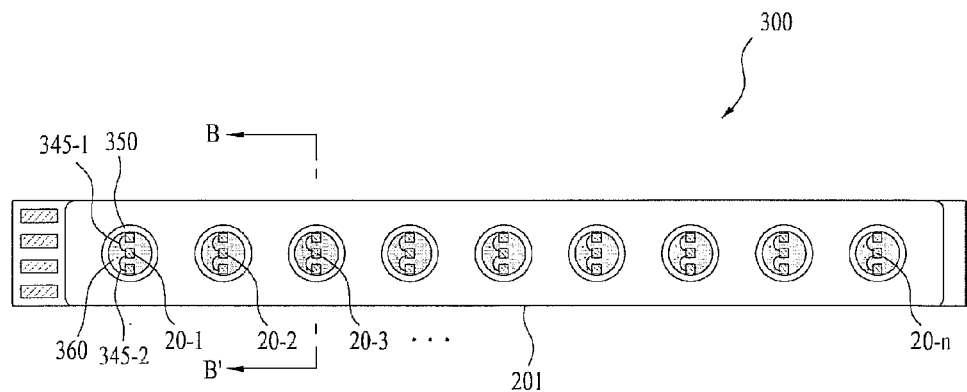
FIG. 5 is a view showing a light emitting module according to another embodiment.
Figure 6:
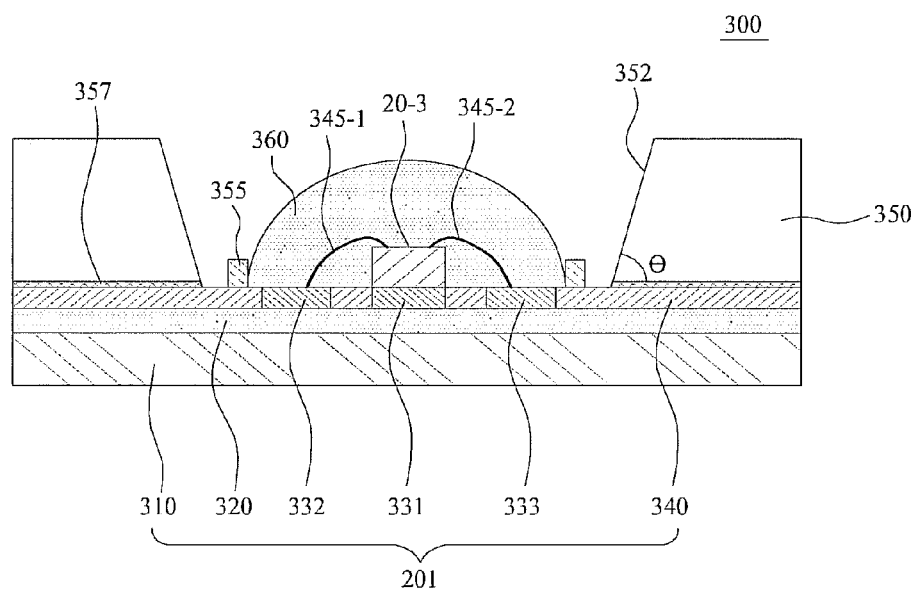
FIG. 6 is a sectional view of the light emitting module shown in FIG. 5 when viewed in a B-B' direction.

FIG. 5 is a view showing a light emitting module 300 according to another embodiment, and FIG. 6 is a sectional view of the light emitting module 300 shown in FIG. 5 when viewed in a B-B' direction.

Referring to FIGS. 5 and 6, the light emitting module 300 includes a circuit board 201, a plurality of light emitting devices 20-1 to 20-n (n is a natural number greater than 1), wires 145, molding parts 360, molding fixing parts 355, and a reflective member 350.

The light emitting devices 20-1 to 20-n are mounted on the circuit board 201 and the light emitting devices 20-1 to 20-n are spaced apart from each other. For example, each of the light emitting devices 20-1 to 20-n may be a horizontal light emitting diode.

Figure 7:
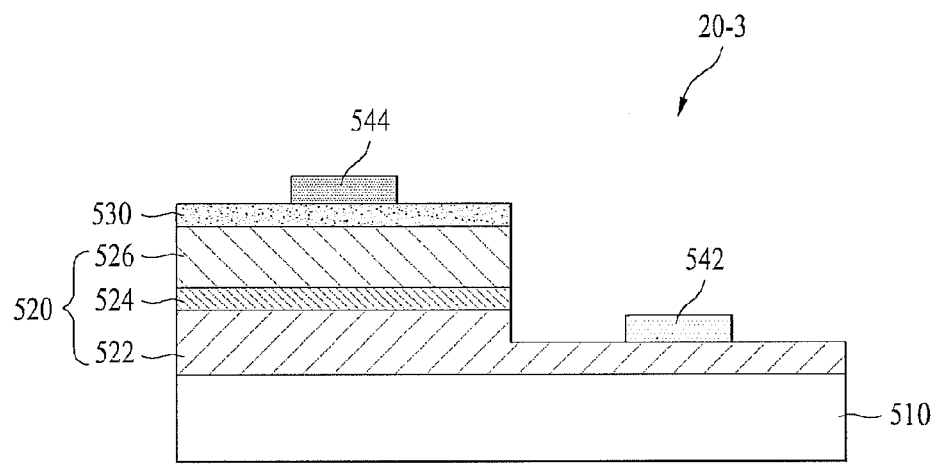
FIG. 7 is a view showing an embodiment of a light emitting device shown in FIG. 6.

FIG. 7 is a view showing an embodiment of the light emitting device 20-3 shown in FIG. 6. Referring to FIG. 7, the light emitting device 20-3 includes a substrate 510, a light emitting structure 520, a conductive layer 530, a first electrode 542, and a second electrode 544.

The substrate 510 may be selected from a group consisting of a sapphire substrate ($Al_2O_3$), GaN, SiC, ZnO, Si, GaP, InP, $Ga_2O_3$, a conductive substrate, and GaAs.

The light emitting structure 520 includes a first conductive type semiconductor layer 542, an active layer 544, and a second conductive type semiconductor layer 546, which may be sequentially stacked on the substrate 510. The first conductive type may be an n type, and the second conductive type may be a p type. However, the first conductive type and the second conductive type are not limited thereto.

The light emitting structure 520 may be mesa etched to expose a portion of the first conductive type semiconductor layer 542.

The conductive layer 520 is disposed on the second conductive type semiconductor layer 546 to improve light extraction efficiency of the light emitting device 20-3. The conductive layer 520 may be formed of a transparent oxide material exhibiting high transmissivity with respect to wavelengths of emitted light, such as indium tin oxide (ITO), tin oxide (TO), indium zinc oxide (IZO), indium tin zinc oxide (ITZO) or zinc oxide (ZnO).

The first electrode 542 may be disposed on the exposed portion of the first conductive type semiconductor layer 542, and the second electrode 544 may be disposed on the conductive layer 530.

The circuit board 201 may include a heat dissipation layer 310, a dielectric layer 320, a first conductive layer 331, a second conductive layer 332, a third metal layer 333, and a solder resist layer 340.

The dielectric layer 320 is disposed on one surface of the heat dissipation layer 310. The first to third metal layers 331 to 333 are disposed on the dielectric layer 320 and the first to third metal layers 331 to 333 are electrically separated from each other. The solder resist layer 340 is disposed on the dielectric layer 320 and at least a portion of the solder resist layer 340 is interposed among the first to third metal layers 331 to 333. The first to third metal layers 331 to 333 may be pattern printed to mount the light emitting devices 20-1 to 20-n.

The light emitting device 20-3 is mounted on the first conductive layer 331. The light emitting device 20-3 may be electrically connected to the second conductive layer 332 and the third metal layer 333.

For example, the first electrode 442 of the light emitting device 20-3 may be electrically connected to the second conductive layer 332 via a first wire 345-1, and the second electrode 444 of the light emitting device 20-3 may be electrically connected to the third metal layer 333 via a second wire 345-2.

The molding part 360 may surround the light emitting device 20-3. Also, the molding part 150 may include a fluorescent substance. The molding part 360 covers at least the light emitting device 20-3 and the wires 345-1 and 345-2. At least a portion of the molding part 150 may have a curvature.

The molding fixing part 355 is disposed at the circumference of the light emitting device 20-3 to fix the edge of the molding part 360. The molding fixing part 355 may be disposed on the dielectric layer or the solder resist layer 340 and the molding fixing part 355 has a circular or oval side wall to fix the circumference of the molding part 360. The molding fixing part 355 may have a height of 40 um to 60 um.

The reflective member 350 is disposed on the dielectric layer or the solder resist layer 340 so as to surround the respective molding parts 360. The reflective member 350 may be spaced from each of the molding fixing parts 355 by a predetermined distance.

In this embodiment, light emitted through the side of the light emitting device 20-3 is reflected by the reflective member 350, thereby adjusting a view angle of the light emitting module 300.

The height of the reflective member 350 may be greater than that of each of the molding parts 360. For example, the uppermost surface of the reflective member 350 may be higher than that of each of the molding parts 360. As a result, the molding parts 360 of the light emitting module 300 are prevented from contacting a light guide plate (see FIG. 13) of a backlight unit or a display apparatus, thereby preventing damage to the light emitting module 300 due to contact.

The reflective member 350 may be formed of polyethylene terephthalate (PET). The reflective member 350 has a predetermined tilt θ with respect to the circuit board 101. Also, the reflective member 350 is provided with a reflective side wall 342 to reflect light emitted from the light emitting device 20-3. The reflective member 350 may be fixed to the dielectric layer or the solder resist layer 340 by a fixing member 357. A bonding agent or a double-sided adhesive tape may be used as the fixing member 357.

In this embodiment, the view angle of the light emitting module 300 is adjusted by the reflective side wall 352 formed of PET exhibiting high reflectance, thereby reducing the amount of light emitted through the side of the light emitting device 20-3.

Figure 8:
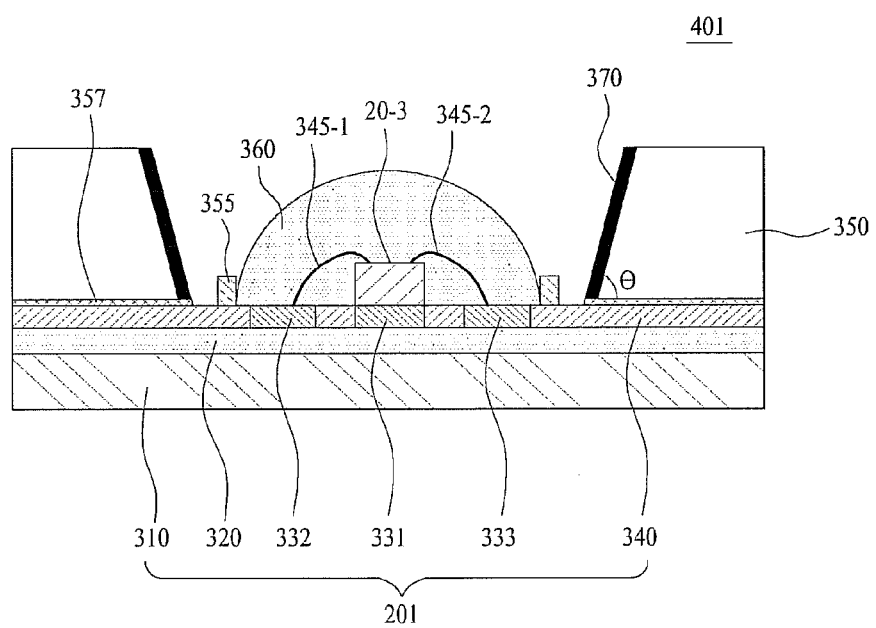
FIG. 8 is a sectional view showing a light emitting module according to another embodiment.

FIG. 8 is a sectional view showing a light emitting module 401 according to another embodiment. Components of this embodiment identical to those of the embodiment shown in FIG. 6 are denoted by the same reference numerals, and a duplicated description thereof will be omitted or briefly given.

The light emitting module 401 shown in FIG. 8 is identical to the light emitting module 300 shown in FIG. 6 except that the light emitting module 401 further includes a reflective coating layer 370. The reflective coating layer 370 may be disposed on the reflective side wall 352 of the reflective member 350. The reflective coating layer 370 may be formed of $TiO_2$, Ag or a reflective sheet. The reflective coating layer 370 may include one or more layers.

Figure 9:
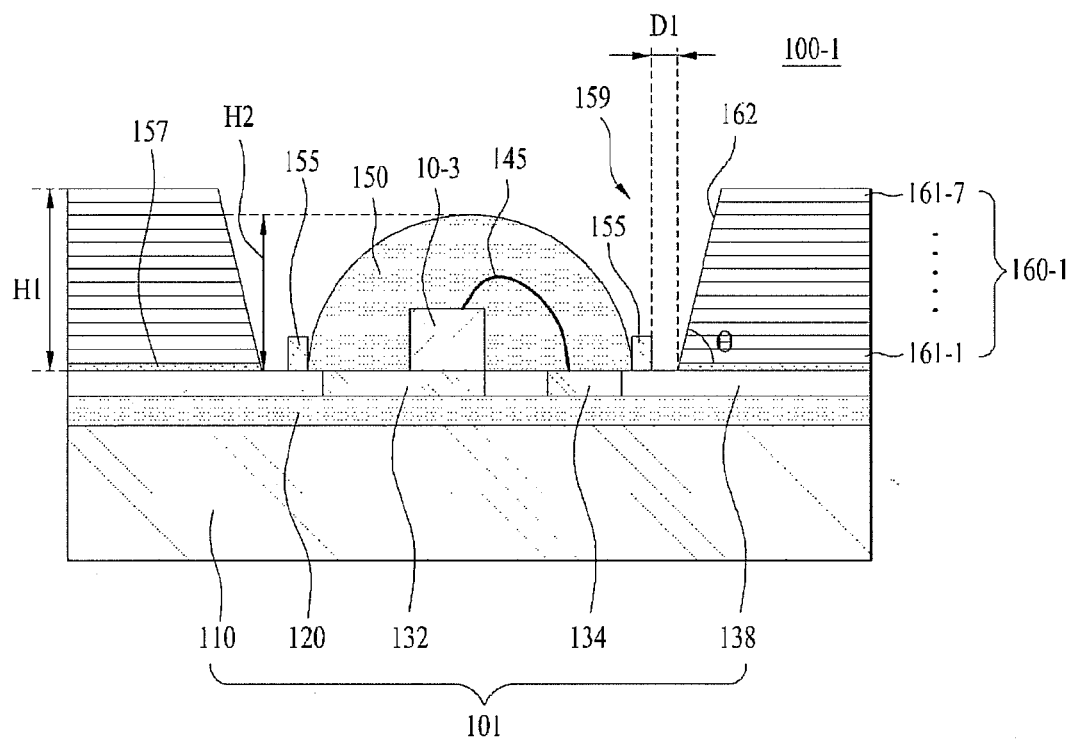
FIG. 9 is a sectional view showing a light emitting module according to another embodiment.

FIG. 9 is a sectional view showing a light emitting module 100-1 according to another embodiment. Components of this embodiment identical to those of the embodiment shown in FIG. 2 are denoted by the same reference numerals, and a duplicated description thereof will be omitted or briefly given.

Referring to FIG. 9, a reflective member 160-1 may include a plurality of layers 161-1 to 161-n (n is a natural number greater than 1). The layers 161-1 to 161-n may be formed of the same reflective materials or different reflective materials. The layers 161-1 to 161-n may be stacked in parallel to the circuit board 101. The upper surface of the uppermost layer 161-n may be higher than that of the molding layer 150.

Figure 10:
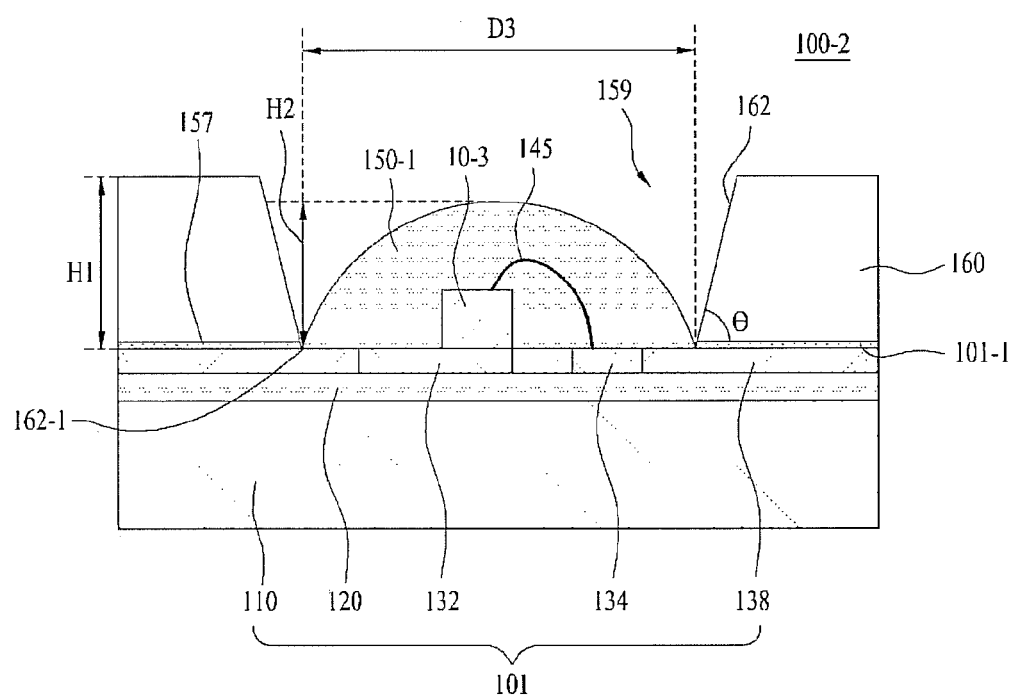
FIG. 10 is a sectional view showing a light emitting module according to another embodiment.

FIG. 10 is a sectional view showing a light emitting module 100-2 according to another embodiment. Components of this embodiment identical to those of the embodiment shown in FIG. 2 are denoted by the same reference numerals, and a duplicated description thereof will be omitted or briefly given.

Referring to FIG. 10, the light emitting module 100-2 is identical to the embodiment shown in FIG. 2 except that the molding fixing part 155 is omitted, and the outer circumference of a molding part 150-1 contacts the lateral surface 162 of a reflective side wall 160. For example, the outer circumference of the molding part 150-1 may contact one end of the lateral surface 162 of the reflective side wall 160 adjacent to an interface 101-1 between the reflective side wall 160 and the circuit board 101.

For example, the diameter D3 of the outer circumference of the molding part 150-1 may be equal to that of one end of an opening 159. One end of the opening 159 may be one end 162-1 of the lateral surface 162 of the reflective side wall 160 contacting the interface 101-1.

Figure 11:
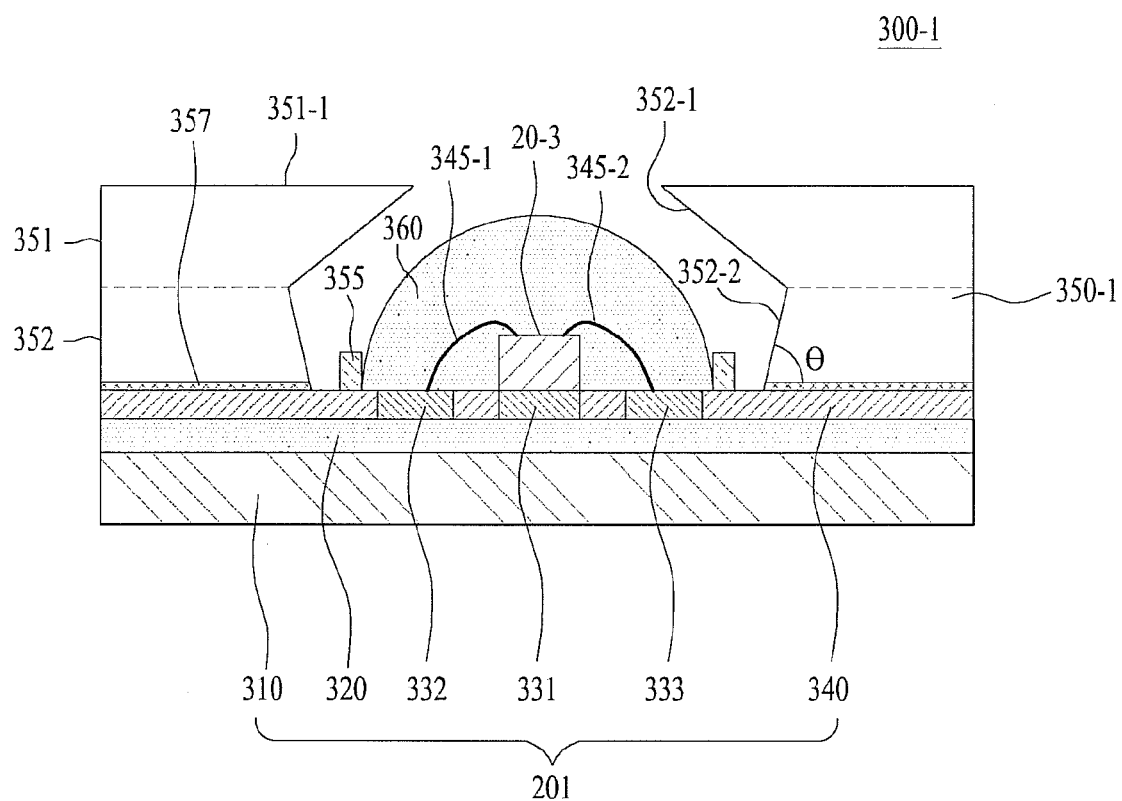
FIG. 11 is a sectional view showing a light emitting module according to a further embodiment.

FIG. 11 is a sectional view showing a light emitting module 300-1 according to a further embodiment. Components of this embodiment identical to those of the embodiment shown in FIG. 6 are denoted by the same reference numerals, and a duplicated description thereof will be omitted or briefly given.

Referring to FIG. 11, a portion of a reflective side wall 350-1 may overlap with a molding part 360 in the vertical direction. Here, the vertical direction may be a direction from a circuit board 210 to a light emitting device (for example, 20-3). For example, the upper end 351 of the reflective side wall 350-1 may have a protrusion 351-1 overlapping with the molding part 360 in the vertical direction. Inner surfaces 352-1 and 352-2 of the reflective side wall 350-1 may be bent. For example, the inner surface 352-1 of the upper end 351 of the reflective side wall 350-1 and the inner surface 352-2 of the lower end 352 of the reflective side wall 350-1 may have different tilts with respect to the circuit board 201. In this embodiment, luminous intensity of the light emitting module 300-1 is adjusted based on how much the protrusion 351-1 overlaps with the molding part 360 in the vertical direction.

In other embodiments, a display apparatus, indication apparatus and illumination system including the light emitting device with the above-stated construction may be realized. For example, the illumination system may include a lamp and a streetlight. Hereinafter, an illumination apparatus and a backlight unit, as an embodiment of the illumination system including the light emitting device, will be described.

Figure 12:
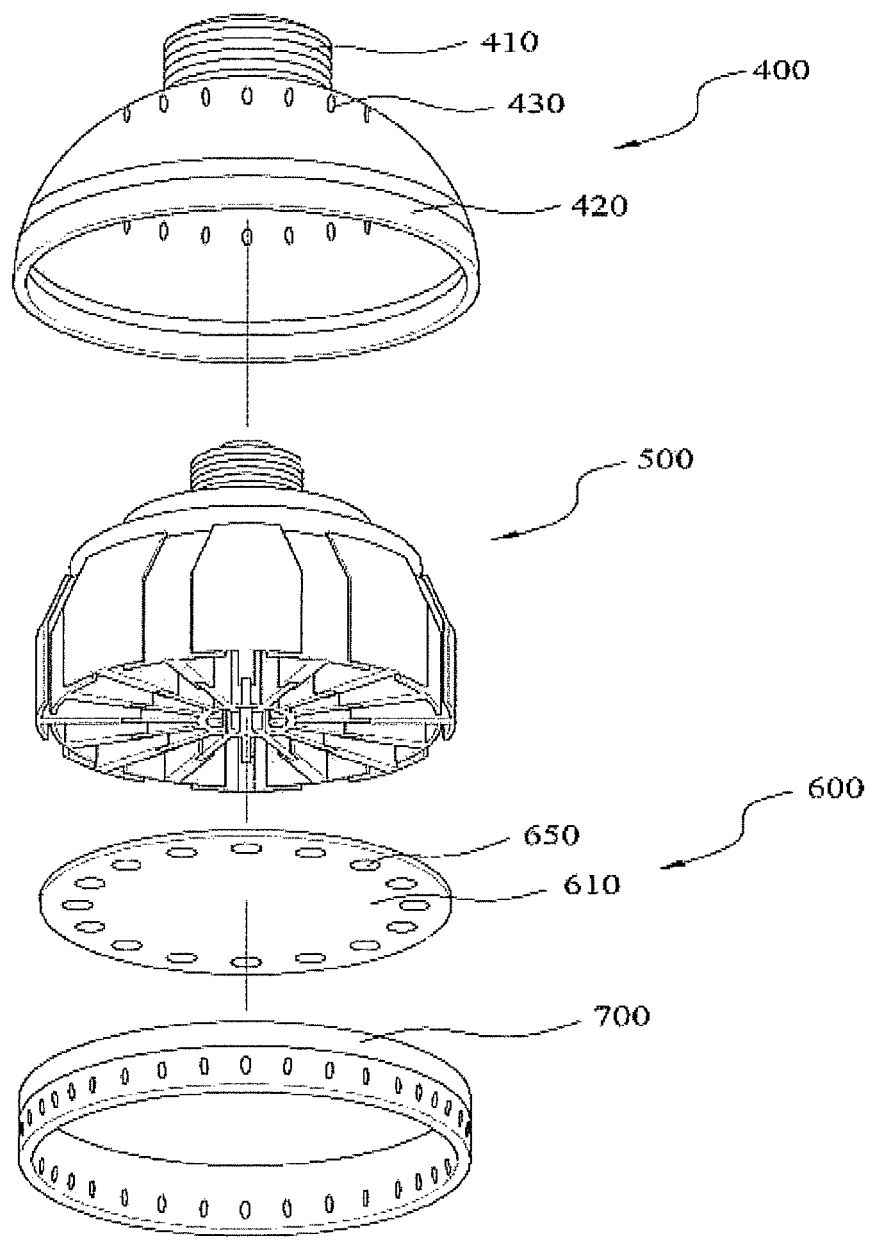
FIG. 12 is a view showing an illumination apparatus including a light emitting module according to an embodiment.

FIG. 12 is a view showing an illumination apparatus including a light emitting module according to an embodiment.

Referring to FIG. 12, the illumination apparatus includes a light source 600 to emit light, a housing 400 in which the light source 600 is mounted, a heat sink 500 to dissipate heat from the light source 600, and a holder 700 to couple the light source 600 and the heat sink 500 to the housing 400.

The housing 400 includes a socket coupling part 410 coupled to an electrical socket (not shown) and a body part 420, connected to the socket coupling part 410, in which the light source 600 is mounted. The body part 420 may have an air flow hole 430.

Alternatively, a plurality of air flow holes 430 may be formed in the body part 420 of the housing 400. That is, one or more air flow holes 430 may be provided. The air flow holes 430 may be arranged at the body part 420 in a radial manner as shown in the drawing or in various other manners.

The light source 600 may be a light emitting module including a plurality of light emitting devices 650 mounted on a board 610. The light emitting module 600 may be one of the previous embodiments. The board 610 may be formed in a shape that can be inserted into an opening of the housing 400. As described below, the board 610 may be formed of a material exhibiting high thermal conductivity to transfer heat to the heat sink 500.

The holder 700 is provided under the light source 600. The holder 700 may have a frame and another air flow hole. Also, although not shown, an optical member may be provided under the light source 6000 to diffuse, scatter or converge light emitted from the light emitting module 600.

Figure 13:
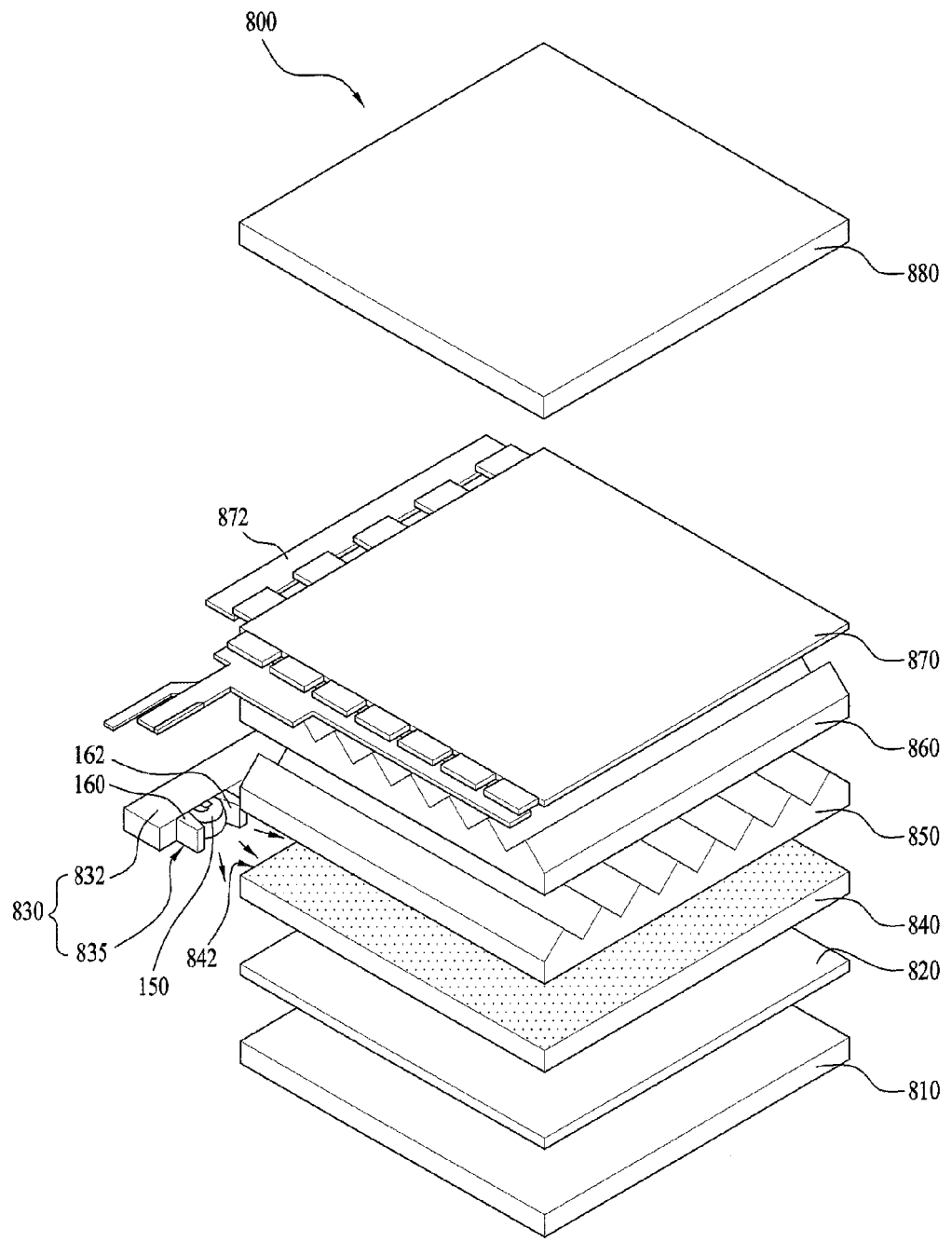
FIG. 13 is a view showing a display apparatus including a light emitting module according to an embodiment.
Figure 14:
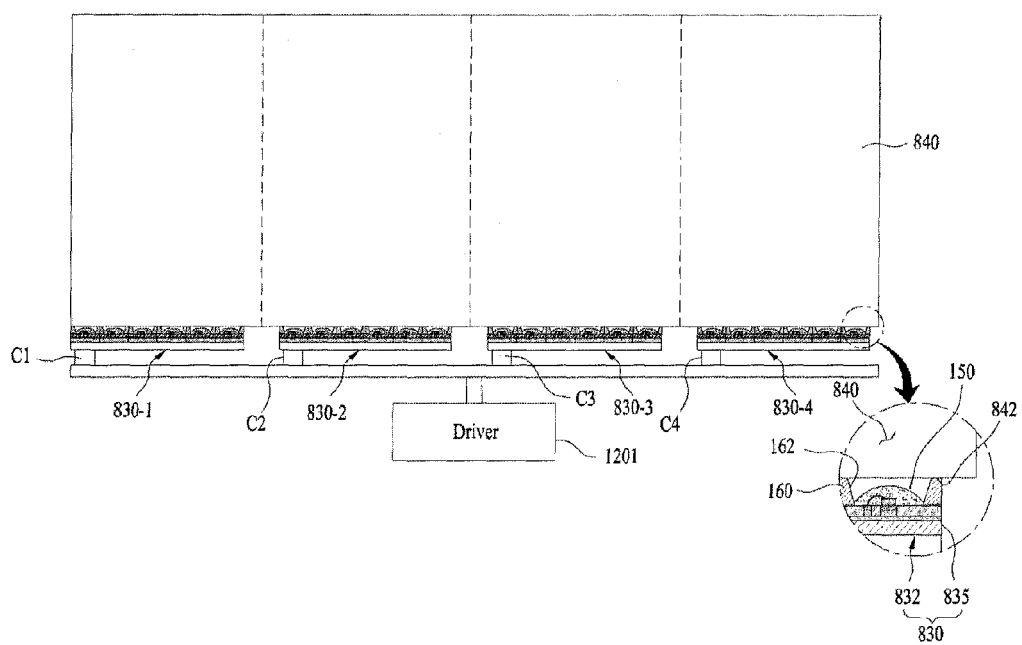
FIG. 14 is a view showing a light emitting device and a light guide plate according to an embodiment.

FIG. 13 is a view showing a display apparatus including a light emitting module according to an embodiment and FIG. 14 is a view showing a light emitting device and a light guide plate according to an embodiment.

Referring to FIG. 13, the display apparatus 800 includes a bottom cover 810, a reflective plate 820 disposed on the bottom cover 810, a light emitting module 830, a light guide plate 840 disposed in front of the reflective plate 820 to guide light emitted from the light emitting module 830 to the front of the display apparatus, an optical sheet including prism sheets 850 and 860 disposed in front of the light guide plate 840, a display panel 870 disposed in front of the optical sheet, an image signal output circuit 872 connected to the display panel 870 to supply an image signal to the display panel 870, and a color filter 880 disposed in front of the display panel 870. Here, the bottom cover 810, the reflective plate 820, the light emitting module 830, the light guide plate 840, and the optical sheet may constitute a backlight unit.

The light emitting module 830 may include a board 832 and light emitting devices 835. Here, a printed circuit board (PCB) may be used as the board 832. The light emitting module 830 may be one of the previous embodiments.

Referring to FIG. 14, the distance from an incidence surface 842 of the light guide plate 840 to the molding part 150 may be greater than the distance from the incidence surface 842 of the light guide plate 840 to the reflective side wall 162.

The upper surface of the reflective side wall 162 of the light emitting module 830 may contact the incidence surface 842 of the light guide plate 840, and the molding part 150 may be spaced apart from the light guide plate 840.

In this embodiment, therefore, the molding part 150 is prevented from directly contacting the incidence surface 842 of the light guide plate 840, thereby preventing damage to the molding part 150. Also, in this embodiment, the height H1 and angle θ of the reflective side wall 162 are changed to adjust a view angle of light incident upon the light guide plate 840.

Components of the display apparatus 800 may be mounted in the bottom cover 810. Although the reflective plate 820 is provided as a separate component as shown in the drawing, the rear of the light guide plate 840 or the front of the bottom cover 810 may be coated with a material exhibiting high reflectance to form the reflective plate 820.

The reflective plate 820 may be formed of a material that exhibits high reflectance and can be formed in a very thin shape. For example, the reflective plate 820 may be formed of polyethylene terephthalate (PET).

The light guide plate 830 may be formed of polymethylmethacrylate (PMMA), polycarbonate (PC) or polyethylene (PE).

The first prism sheet 850 may be formed by attaching an elastic polymer material exhibiting light transmission to one surface of a support film. The polymer may have a prism layer in which a plurality of three-dimensional patterns is repeatedly formed. Here, the patterns may be formed in a stripe type including alternately arranged ridges and valleys.

The extension direction of the ridges and valleys formed at one surface of the support film of the second prism sheet 860 may be perpendicular to the extension direction of the ridges and valleys formed at one surface of the support film of the first prism sheet 850. As a result, light transmitted from the light emitting module and the reflective sheet is uniformly distributed to the front of the display panel 870.

Also, although not shown, a diffusion sheet may be disposed between the light guide plate 840 and the first prism sheet 850. The diffusion sheet may be formed of polyester-based or polycarbonate-based material. The diffusion sheet may refract and scatter light emitted from the backlight unit to maximize a light incidence angle. Also, the diffusion sheet may include a support layer containing a light dispersing agent and a first and second layer, not containing a light dispersing agent, formed at a light emission surface (toward the first prism sheet) and a light incidence surface (toward the reflective sheet).

In this embodiment, the diffusion sheet, the first prism sheet 850 and the second prism sheet 860 constitute an optical sheet. Alternatively, the optical sheet may be constituted by other combinations, such as a micro lens array, a combination of the diffusion sheet and the micro lens array, or a combination of one of the prism sheets and the micro lens array.

A liquid crystal display panel may be used as the display panel 870. Alternatively, other kinds of display apparatuses requiring a light source may be provided in addition to the liquid crystal display panel 860.

Figure 15:
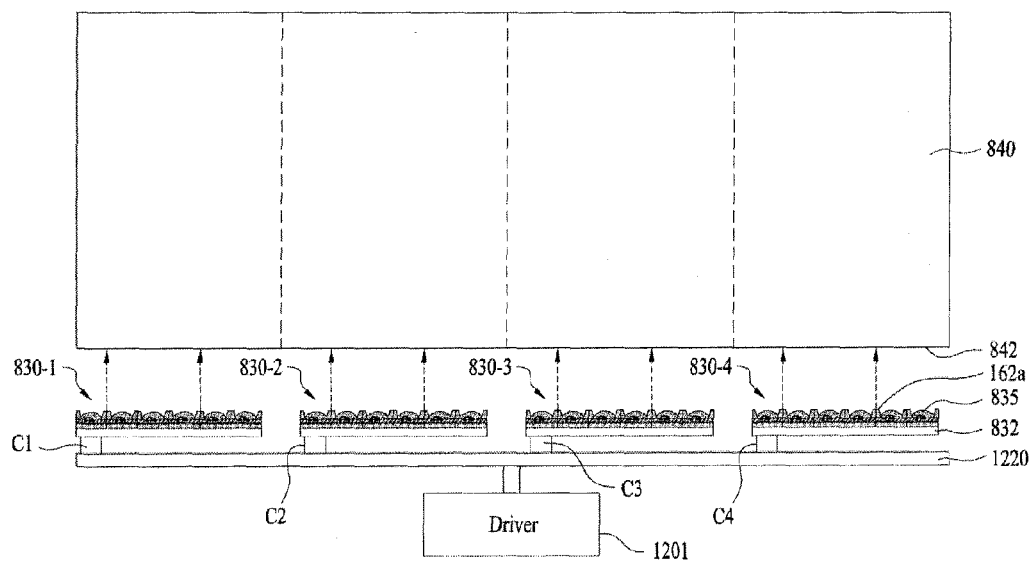
FIG. 15 is a view showing an embodiment of driving the light emitting module in the display apparatus shown in FIG. 13.

FIG. 15 is a view showing an embodiment of driving the light emitting module 830 in the display apparatus 800 shown in FIG. 13.

The display apparatus 800 further includes a driver 1201 to drive the light emitting module 830. The driver 1201 is connected to a board 1220, and light emitting modules 830-1 to 830-4 are connected to the board 1220 via connectors C1 to C4.

The driver 1201 transmits drive signals to the light emitting modules 830-1 to 830-4 via the board 1220 and the connectors C1 to C4 so that the light emitting modules 830-1 to 830-4 can be driven according to the drive signals. Consequently, different drive signals may be supplied to the light emitting modules 830-1 to 830-4 to adjust light supplied to regions of the light guide plate 840 divided by dotted lines.

As is apparent from the above description, in embodiments, a view angle of light is adjusted, thereby reducing optical loss.

Although embodiments have been described with reference to a number of illustrative embodiments thereof, it should be understood that numerous other modifications and embodiments can be devised by those skilled in the art that will fall within the spirit and scope of the principles of this disclosure. More particularly, various variations and modifications are possible in the component parts and/or arrangements of the subject combination arrangement within the scope of the disclosure, the drawings and the appended claims. In addition to variations and modifications in the component parts and/or arrangements, alternative uses will also be apparent to those skilled in the art.

What is claimed is:

1. A light emitting module comprising:
a circuit board;
a plurality of light emitting devices disposed on the circuit board and spaced apart from each other;
molding parts disposed on circuit board and molded around the respective light emitting devices;
a reflective member disposed on the circuit board surrounding the light emitting devices, wherein the reflective member has a height greater than that of each of the molding parts; and
molding fixing parts disposed on the circuit board and contacting outer circumferences of the respective molding parts and fixing edges of the respective molding parts,
wherein the reflective member has a plurality of openings exposing the light emitting devices, and each of the openings has a reflective side wall extending upward from the circuit board, and
wherein the reflective side wall is spaced apart from the respective molding parts and the molding fixing parts are spaced apart from the light emitting devices, and portions of the molding parts are disposed between the light emitting devices and the molding fixing parts.

2. The light emitting module according to claim 1, wherein the reflective member is formed of polyethylene terephthalate.

3. The light emitting module according to claim 1, wherein the circuit board comprises:
a heat dissipation layer;
a dielectric layer disposed on one surface of the heat dissipation layer; and
a first conductive layer and a second conductive layer disposed on the dielectric layer and electrically separated from each other, and wherein each of the light emitting devices is electrically connected to the first conductive layer and the second conductive layer.

4. The light emitting module according to claim 3, wherein the circuit board further comprises a solder resist layer disposed on the dielectric layer and at least a portion of the solder resist layer is interposed between the first conductive layer and the second conductive layer.

5. The light emitting module according to claim 1, wherein the openings are through holes, wherein each of the through holes has the reflective side wall.

6. The light emitting module according to claim 5, wherein the reflective member is spaced apart from the molding fixing parts.

7. The light emitting module according to claim 1, wherein the reflective side walls are tilted with respect to the circuit board.

8. The light emitting module according to claim 7, wherein an outer circumference of each of the molding parts contacts a lateral surface of a corresponding one of the reflective side walls.

9. The light emitting module according to claim 1, further comprising a fixing member positioned between the circuit board and the reflective member.

10. The light emitting module according to claim 1, further comprising reflective coating layers disposed on the respective reflective side walls.

11. The light emitting module according to claim 10, wherein each of the reflective coating layers is formed of at least one selected from among $TiO_2$, Ag and a reflective sheet.

12. The light emitting module according to claim 1, wherein at least a portion of the reflective member is spaced apart from the molding parts.

13. The light emitting module according to claim 1, wherein a portion of the reflective member has a protrusion overlapping with each of the molding parts in a vertical direction.

14. The light emitting module according to claim 1, further comprising at least one wire electrically connecting each of the light emitting devices to a first conductive layer and a second conductive layer.

15. The light emitting module according to claim 14, wherein each of the molding parts covers a corresponding one of the light emitting devices and the wire, and at least a portion of each of the molding parts has a curvature.

16. The light emitting module according to claim 1, wherein each of the openings is formed in a circular or polygonal shape.

17. The light emitting module according to claim 1, wherein the reflective member comprises a plurality of layers, and an uppermost surface of the reflective member is higher than an uppermost surface of each of the molding parts.

18. An illumination system comprising:
 a bottom cover;
 a reflective plate disposed on the bottom cover;
 a light guide plate disposed on the reflective plate, wherein the light guide plate has an incidence surface upon which light is incident;
 a light emitting module emitting light to the incidence surface;
 an optical sheet disposed on the light guide plate; and
 a display panel disposed on the optical sheet, wherein the light emitting module comprises:
 a circuit board;
 a plurality of light emitting devices mounted on the circuit board and spaced apart from each other;
 molding parts disposed on the circuit board and wrapping the respective light emitting devices;
 a reflective member disposed on the circuit board surrounding the light emitting devices, wherein the reflective member has a height greater than that of each of the molding parts; and
 molding fixing parts disposed on the circuit board and contacting outer circumferences of the respective molding parts and fixing edges of the respective molding parts,
 wherein the reflective member has a plurality of openings exposing the light emitting devices, and each of the openings has a reflective side wall extending upward from the circuit board, and
 wherein the reflective side wall is spaced apart from the respective molding parts and the molding fixing parts are spaced apart from the light emitting devices, and portions of the molding parts are disposed between the light emitting devices and the molding fixing parts.

19. The illumination system according to claim 18, wherein a distance from the incidence surface to an uppermost surface of each of the molding parts is greater than a distance from the incidence surface to an uppermost surface of a corresponding one of the reflective side walls.

20. An illumination system comprising:
 a bottom cover;
 a reflective plate disposed on the bottom cover;
 a light guide plate disposed on the reflective plate, wherein the light guide plate has an incidence surface upon which light is incident;
 a light emitting module emitting light to the incidence surface;
 an optical sheet disposed on the light guide plate; and
 a display panel disposed on the optical sheet, wherein the light emitting module comprises:
 a circuit board;
 a plurality of light emitting devices mounted on the circuit board and spaced apart from each other;
 molding parts disposed on the circuit board and wrapping the respective light emitting devices; and
 a reflective member disposed on the circuit board surrounding the light emitting devices, wherein the reflective member has a height greater than that of each of the molding parts, and
 wherein the reflective member has a plurality of openings exposing the light emitting devices, and each of the openings has a reflective side wall extending upward from the circuit board, and wherein the uppermost surface of each of the reflective side walls contacts the incidence surface, and the uppermost surface of each of the molding parts is spaced apart from the incidence surface.

\* \* \* \* \*